(12) United States Patent
Hyun et al.

(10) Patent No.: US 8,774,747 B2
(45) Date of Patent: Jul. 8, 2014

(54) RADIO FREQUENCY RECEIVER

(75) Inventors: Seok-bong Hyun, Daejeon (KR); Bong Hyuk Park, Daejeon (KR); Yun Ho Choi, Daejeon (KR); Jae Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 207 days.

(21) Appl. No.: 13/488,902

(22) Filed: Jun. 5, 2012

(65) Prior Publication Data

US 2013/0135048 A1    May 30, 2013

(30) Foreign Application Priority Data

Nov. 25, 2011  (KR) ................. 10-2011-0124217

(51) Int. Cl.
    *H04B 1/10* (2006.01)
    *H03D 1/06* (2006.01)
(52) U.S. Cl.
    USPC ....... 455/296; 455/63.1; 455/67.13; 455/295; 375/346
(58) Field of Classification Search
    USPC ............. 455/296, 63.1, 67.13, 295, 307, 333, 455/334, 302, 293, 285, 284, 114.2, 130; 327/358, 359; 375/346, 348, 350
    See application file for complete search history.

(56) References Cited

U.S. PATENT DOCUMENTS

| | | | | |
|---|---|---|---|---|
| 6,397,051 | B1 * | 5/2002 | Abbasi et al. | 455/295 |
| 7,346,134 | B2 * | 3/2008 | Smith | 375/346 |
| 7,876,867 | B2 * | 1/2011 | Filipovic et al. | 375/346 |
| 7,899,426 | B2 | 3/2011 | Tasic et al. | |
| 8,035,447 | B2 * | 10/2011 | Liu et al. | 330/149 |
| 8,320,866 | B2 * | 11/2012 | Pratt et al. | 455/295 |
| 8,330,522 | B2 * | 12/2012 | Chen et al. | 327/358 |
| 8,421,541 | B2 * | 4/2013 | Sengupta et al. | 330/301 |
| 2010/0317311 | A1 | 12/2010 | Mirzaei et al. | |
| 2010/0329158 | A1 * | 12/2010 | Sengupta et al. | 370/278 |
| 2012/0252374 | A1 * | 10/2012 | Mattisson et al. | 455/73 |

OTHER PUBLICATIONS

Himanshu Khatri et al., "Integrated RF Interference Suppression Filter Design Using Bond-Wire Inductors", IEEE Transactions on Microwave Theory and Techniques, May 2008, pp. 1024-1034, vol. 56 No. 5, IEEE.
Namsoo Kim et al., "A Highly Linear SAW-Less CMOS Receiver Using a Mixer With Embedded Tx Filtering for CDMA", IEEE Journal of Solid-State Circuits, Aug. 2009, pp. 2126-2137, vol. 44 No. 8, IEEE.
Vladimir Aparin et al., "An Integrated LMS Adaptive Filter of TX Leakage for CDMA Receiver Front Ends", IEEE Journal of Solid-State Circuits, May 2006, pp. 1171-1182, vol. 41, No. 5, IEEE.

* cited by examiner

*Primary Examiner* — Pablo Tran

(57) ABSTRACT

A radio frequency receiver of the present invention removes out-of-band jamming signals and interference signals without SAW filters. The radio frequency receiver includes: a low noise amplifier amplifying a signal received through an antenna; a second order intermodulation cancellation unit removing second order intermodulation caused by an out-of-band jamming or interference signal included in the signal output from the low noise amplifier; a passive mixer unit converting a frequency of the signal output from the second order intermodulation cancellation unit; and a low pass filter unit removing an out-of-band jamming or interference signal included in the signal output from the passive mixer unit and delivering the signal with the out-of-band jamming or interference signal removed therefrom to a transimpedance amplifier.

13 Claims, 8 Drawing Sheets

RADIO FREQUENCY RECEIVER

CROSS-REFERENCE TO RELATED APPLICATIONS

This U.S. non-provisional patent application claims priority under 35 U.S.C. §119 of Korean Patent Application No. 10-2011-0124217, filed on Nov. 25, 2011, the entire contents of which are hereby incorporated by reference.

BACKGROUND OF THE INVENTION

The present invention disclosed herein relates to a radio frequency receiver, and more particularly, to a radio frequency receiver for removing out-of-band interference signals or jamming signals.

To remove interference signals or jamming signals in frequency bands other than a specific band, Surface Acoustic Wave (SAW) filters are widely used in base stations or terminals in contemporary wireless communication systems.

Terminals used in next-generation mobile communication such as LTE-Advanced should be capable of multi-band radio communication. Thus, front-end architectures of radio frequency receivers in the terminals tend to be complicated and expensive. For Multi-Input Multi-Output (MIMO), in particular, the number of filters will increase in proportion to the number of antennas, and the front-ends will become more complicated in typical radio frequency receivers. Accordingly, SAW-less technologies, which can reduce the number of SAW filters or eliminate the SAW filters, are required.

Representative methods of implementing a SAW-less receiver include using a TX canceller, an on-chip filter with bonding-wire inductors, an on-chip filter with active inductors, and a passive mixer having stop-band rejection characteristics.

Using a TX canceller has limitations in that noise figure performance of a receiver is degraded, interference rejection performance changes according to group delay characteristics, and cross modulation distortion performance is degraded due to non-linearity. Using bonding-wire also has limitations in that bonding wire properties change in an actual manufacturing process, thus failing to ensure uniform quality. Using an on-chip filter with active inductors also has limitations in that noise figure is not better than passive inductors due to thermal noise generated by active devices, and active devices consume more power and their characteristics change more easily than passive inductors. The use of a stop-band rejection passive mixer is applied to a portion of Qualcomm Incorporated's commercial chips. However, in order to be applied to broadband systems such as LTE-Advanced, higher-order variable filter characteristics are required in comparison with the existing CDMA system.

For systems such as CDMA that have a relatively narrow broad bandwidth (of 1.25 MHz, for example), typical SAW-less receivers can remove jamming signals to some degree because the duplex gap between a desired signal frequency and a jamming signal frequency is sufficiently greater than a signal bandwidth by about 40 times. However, in broadband systems such as LTE, typical SAW-less receivers cannot sufficiently remove jamming signals.

SUMMARY OF THE INVENTION

The present invention provides a radio frequency receiver for removing out-of-band jamming signals and interference signals without Surface Acoustic Wave (SAW) filters.

The present invention also provides a radio frequency receiver used in multi-band MIMO and having a simple structure.

The present invention also provides a radio frequency receiver used in multi-band MIMO and readily manufacturable at low cost.

The present invention also providers a radio frequency receiver effective for mobile communication having a variable bandwidth and using broadband signals.

Embodiments of the present invention provide a radio frequency receiver including: a low noise amplifier (LNA) amplifying a signal received through an antenna; a second order intermodulation cancellation unit removing second order intermodulation caused by an out-of-band jamming or interference signal included in a signal output from the low noise amplifier; a passive mixer unit converting a frequency of a signal output from the second order intermodulation cancellation unit; and a low pass filter unit removing an out-of-band jamming or interference signal included in a signal output from the passive mixer unit and delivering the signal from which the out-of-band jamming or interference signal is removed to a transimpedance amplifier (TIA).

In some embodiments, the second order intermodulation cancellation unit may include: a signal amplifier unit converting the signal output from the low noise amplifier into a current signal and differentially amplifying the current signal; and a second intercept point (IP2) control unit calibrating mismatch between a plurality of differentially amplified signals.

In other embodiments, the signal amplifier unit may include: an in-phase amplifier unit amplifying an in-phase signal of the output signal of the low noise amplifier; and an out-of-phase amplifier unit amplifying an out-of-phase signal of the output signal of the low noise amplifier.

In still other embodiments, the IP2 control unit may calculate mismatch caused by a manufacturing process of the signal amplifier unit or mismatch caused by aging of the signal amplifier unit.

In even other embodiments, the mismatch caused by a manufacturing process may include mismatch due to source voltage variation or mismatch due to temperature variation.

In yet other embodiments, the IP2 control unit may include: a logic circuit storing in advance calibration data for calibrating the mismatch between the plurality of differentially amplified signals; and a switch unit controlling outputs of the in-phase amplifier unit and the out-of-phase amplifier unit through an output of the logic circuit.

In further embodiments, the in-phase amplifier unit, the out-of-phase amplifier unit, and the switch unit may include a plurality of transistors, respectively, the transistors included in the in-phase amplifier unit being connected in cascade, the transistors included in the out-of-phase amplifier unit being connected in cascade, and the transistors included in the switch unit being connected with the transistors included in the in-phase amplifier unit and the out-of-phase amplifier unit in cascode, and the logic circuit may change equivalent resistances of transistors included in the switch unit.

In still further embodiments, the low pass filter unit may include an RC low pass filter including a resistor and a capacitor and a filter control unit controlling a pass band of the RC low pass filter.

In even further embodiments, the filter control unit may change an equivalent capacitance of the RC low pass filter.

In yet further embodiments, the RC low pass filter may include an RC network having a specific resistance and capacitance; a plurality of capacitors connected with the RC network in parallel; and a switch unit changing equivalent capacitances of the plurality of capacitors, and the filter control unit may control the switch unit.

In much further embodiments, the low pass filter unit may deliver the current signal to the transimpedance amplifier in proportion to an impedance seen from an input end of the passive mixer unit, the impedance having a maximum value at a local oscillator (LO) frequency and decreasing symmetrically with respect to the LO frequency in directions away from the LO frequency.

In still much further embodiments, the radio frequency receiver may further include a band pass filter unit receiving signals through the antenna and delivering a signal of a predetermined frequency band among the received signals to the low noise amplifier.

In yet much further embodiments, the band pass filter unit may include an on-chip filter provided in the form a transmission line on a silicon substrate and a matching unit matching impedances between the on-chip filter and the antenna.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Foregoing general illustrations and following detailed descriptions are exemplified to provide an additional explanation of the claimed invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when an element is referred to in the detailed description as being included, this means that another element may be included. Furthermore, an embodiment described and exemplified herein includes a complementary embodiment thereof. Hereinafter, embodiments of the present invention will be described in detail with reference to the accompanying drawings.

Figure 1:
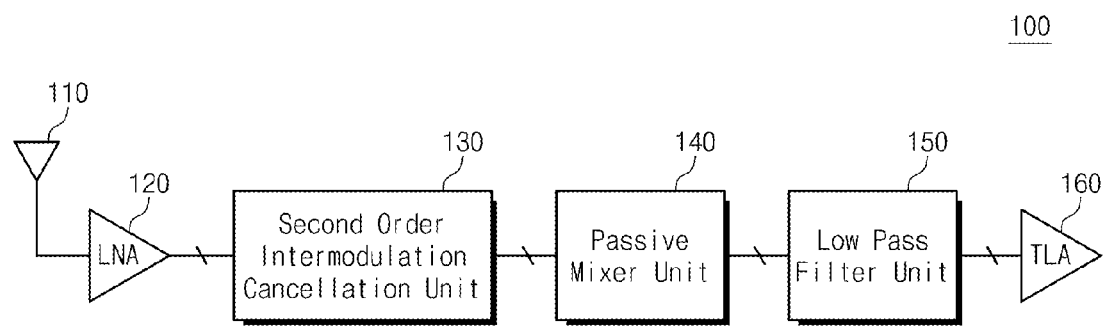
FIG. 1 is a view illustrating a radio frequency receiver according to an embodiment of the present invention.

FIG. 1 is a view illustrating a radio frequency receiver 100 according to an embodiment of the present invention.

Referring to FIG. 1, the radio frequency receiver 100 includes an antenna 110, a low noise amplifier (LNA) 120, a second order intermodulation cancellation unit 130, a passive mixer unit 140, a low pass filter unit 150, and a transimpedance amplifier 160.

The antenna 110 receives a radio frequency signal and delivers the received radio frequency signal to the low noise amplifier 120.

The low noise amplifier 120 amplifies the signal received through the antenna 110 while adding less noise and delivers the amplified signal to the second order intermodulation cancellation unit 130.

The second order intermodulation cancellation unit 130 receives the signal output from the low noise amplifier 120 and cancels second order intermodulation caused by out-of-band interference signals or jamming signals included in the received signal. The signal from which the second order intermodulation is removed is delivered to the passive mixer unit 140. In wireless communication systems, receivers and transmitters operate simultaneously. During a signal communication process, some energy of a transmitted signal leaks to a receiver. Such a leakage signal is included in the same frequency band as a received signal and generates second order intermodulation. A specific embodiment of the second order intermodulation cancellation unit 130 will be described with reference to FIG. 2.

The passive mixer unit 140 receives the signal output from the second order intermodulation cancellation unit 130, converts the frequency of the received signal, and then delivers the converted signal to the low pass filter unit 150. During this process, the passive mixer unit 140 up-converts impedance characteristics which are seen from an input end of the low pass filter unit 150 by the amount of a local oscillator (LO) frequency. That is, when the relation between current and impedance characteristics seen from the input end of the passive mixer unit 140 is considered, the passive mixer unit 140 and the low pass filter unit 150 function like a band pass filter having the LO frequency as a center frequency. Relevant descriptions will be made in detail with reference to FIG. 8.

The low pass filter unit 150 receives the signal output from the passive mixer unit 140 and removes out-of-band interference signals or jamming signals from the received signal and then delivers the signal from which interference signals or jamming signals are removed to the transimpedance amplifier 160.

The transimpedance amplifier 160 converts the signal received from the low pass filter unit 150 into a voltage signal and amplifies the voltage signal.

Figure 2:
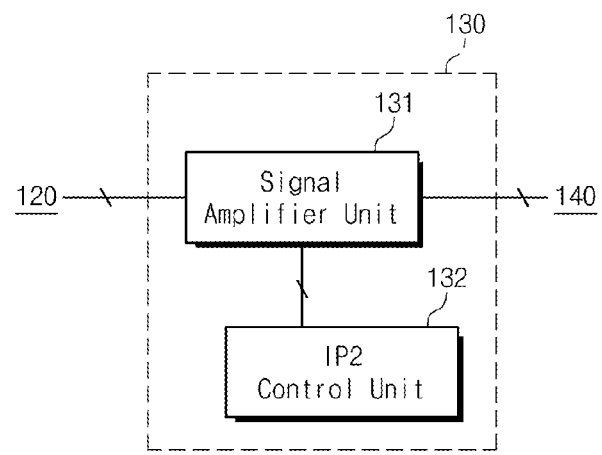
FIG. 2 is a view particularly illustrating a second order intermodulation cancellation unit included in the radio frequency receiver of FIG. 1.

FIG. 2 is a view particularly illustrating the second order intermodulation cancellation unit 130 included in the radio frequency receiver 100 of FIG. 1. Referring to FIG. 2, the second order intermodulation cancellation unit 130 includes a signal amplifier unit 131 and an IP2 control unit 132.

The signal amplifier unit 131 receives the signal output from the low noise amplifier 120 and converts the received signal to a current signal and then differentially amplifies the current signal. The amplified current signal is delivered to the passive mixer unit 140.

The second intercept point (IP2) control unit 132 calibrates mismatch between differential signals amplified in the signal amplifier unit 131. The mismatch which can be calibrated by the IP2 control unit 132 may include mismatch caused by a manufacturing process of the signal amplifier unit 131 and mismatch caused by aging of the signal amplifier unit 131. In particular, the mismatch caused by a manufacturing process may include mismatch due to source voltage variation or mismatch due to temperature variation. For example, mismatch of a circuit caused by source voltage variation may be calibrated by: measuring an offset current output when no signal is input to the circuit while changing the source voltage of the circuit from 0.6V to 5V at predetermined intervals (10 mV) according to the characteristics of the circuit; and then setting the offset current to zero.

Although an integrated circuit is manufactured in a sophisticated process, mismatch may occur in differential signals amplified by the integrated circuit if no separate calibration operation is performed. The mismatch between the differential signals causes second order intermodulation. The IP2 control unit 132 included in the second order intermodulation cancellation unit 130 calibrates mismatch between amplified differential signals to reduce second order intermodulation.

The radio frequency receiver 100 according to the present invention does not include a SAW filter. Since the radio frequency receiver 100 includes no SAW filter but elements 120 to 150 which can be disposed on a single substrate in the form of an integrated circuit, the radio frequency receiver 100 according to the present invention can have a simple configuration and high integration efficiency and be manufactured at low cost, compared to typical receivers.

Figure 3:
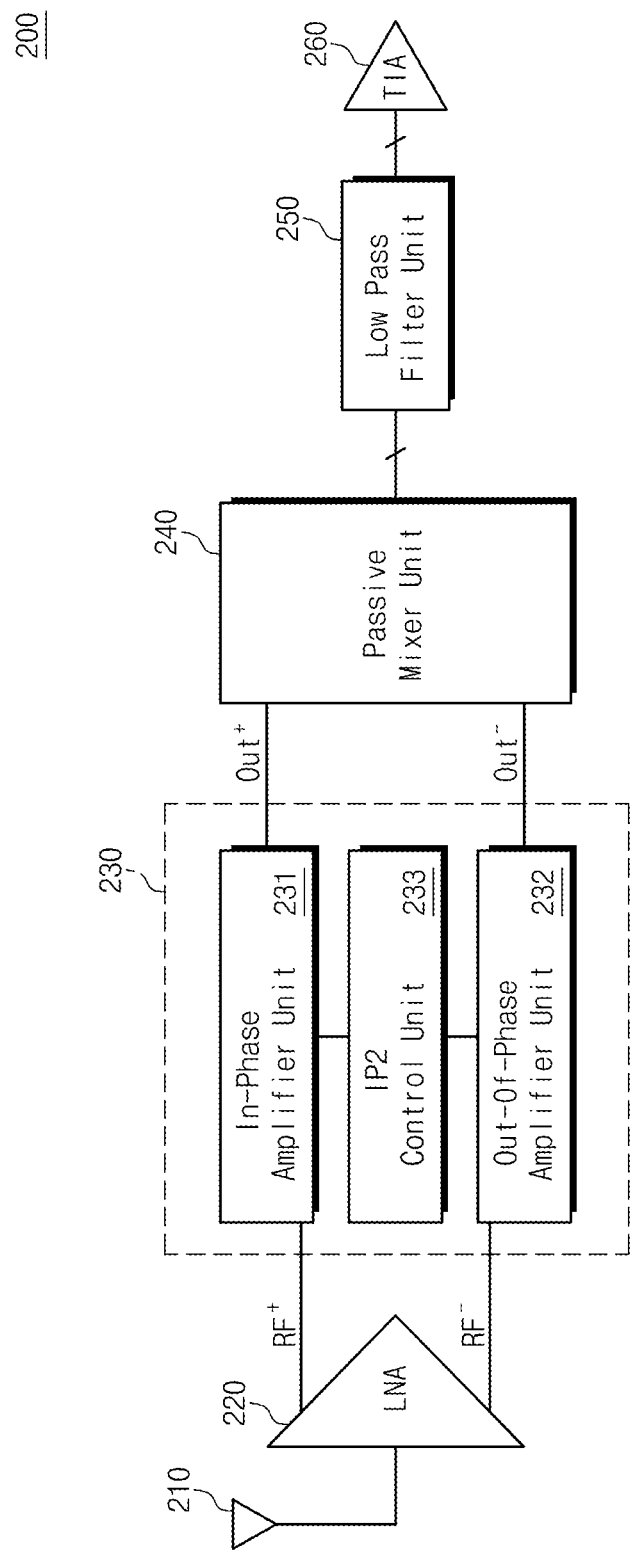
FIG. 3 is a view illustrating a radio frequency receiver according to another embodiment of the present invention.

FIG. 3 is a view illustrating a radio frequency receiver 200 according to another embodiment of the present invention. Referring to FIG. 3, the radio frequency receiver 200 includes an antenna 210, a low noise amplifier 220, a second order intermodulation cancellation unit 230, a passive mixer unit 240, a low pass filter unit 250, and a transimpedance amplifier 260.

The antenna 210, the low noise amplifier 220, the passive mixer unit 240, the low pass filter unit 250, and the transimpedance amplifier 260 are the same as those described in FIG. 1. Thus, detailed descriptions thereof will be omitted.

The second intermodulation cancellation unit 230 includes an in-phase amplifier unit 231, an out-of-phase amplifier unit 232, and an IP2 control unit 233. The second order intermodulation cancellation unit 230 receives a signal output from the low noise amplifier 220 and cancels second order intermodulation caused by out-of-band interference signals or jamming signals included in the received signal. The signal from which the second order intermodulation is removed is delivered to the passive mixer unit 240.

The in-phase amplifier unit 231 receives an in-phase signal RF+ of a differential signal output from the low noise amplifier 220 and amplifies the received in-phase signal RF+. The amplified in-phase signal Out+ is delivered to the passive mixer unit 240.

The out-of-phase amplifier unit 232 receives an out-of-phase signal RF− of the differential signal output from the low noise amplifier 220 and amplifies the received out-of-phase signal RF−. The amplified out-of-phase signal Out− is delivered to the passive mixer unit 240.

The IP2 control unit 233 calibrates mismatch between the in-phase signal Out+ amplified in the in-phase amplifier unit 231 and the out-of-phase signal Out− amplified in the out-of-phase amplifier unit 232. The mismatch which can be calibrated by the IP2 control unit 233 may include mismatch caused by manufacturing processes of the in-phase amplifier unit 231 and the out-of-phase amplifier unit 232 and mismatch caused by aging of the in-phase amplifier unit 231 and the out-of-phase amplifier unit 232. That is, the IP2 control unit 233 calibrates mismatch between amplified differential signals to reduce second order intermodulation.

Figure 4:
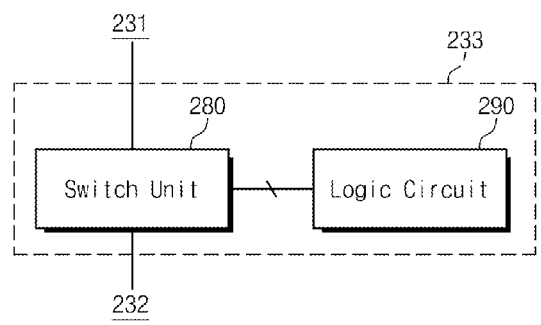
FIG. 4 is a view particularly illustrating an IP2 control unit included in the radio frequency receiver of FIG. 3.

FIG. 4 is a view particularly illustrating the IP2 control unit 233 included in the radio frequency receiver 200 of FIG. 3. Referring to FIG. 4, the IP2 control unit 233 includes a switch unit 280 and a logic circuit 290.

The switch unit 280 controls the outputs of the in-phase amplifier unit 231 and the out-of-phase amplifier unit 232 according to data output from the logic circuit 290. For example, the mismatch between differential signals Out+ and Out− can be compensated for by delaying any one of outputs of the in-phase amplifier unit 231 and the out-of-phase amplifier unit 232 by a certain time.

The logic circuit 290 previously stores calibration data for the calibration of the mismatch between the amplified differential signals Out+ and Out−. For example, so as to calibrate mismatch of a circuit caused by source voltage variation, while changing the source voltage of the circuit from 0.6V to 5V at predetermined intervals (10 mV) according to the characteristics of the circuit, an offset current output when no signal is input to the circuit may be measured, and data for making the offset current zero may be stored in the form of a look up table.

As a result, since the radio frequency receiver 200 according to the present invention includes no SAW filter but elements 220 to 250 which can be disposed on a single substrate in the form of an integrated circuit, the radio frequency receiver 200 according to the present invention can have a simple configuration and high integration efficiency and be manufactured at low cost, compared to typical receivers.

Figure 5:
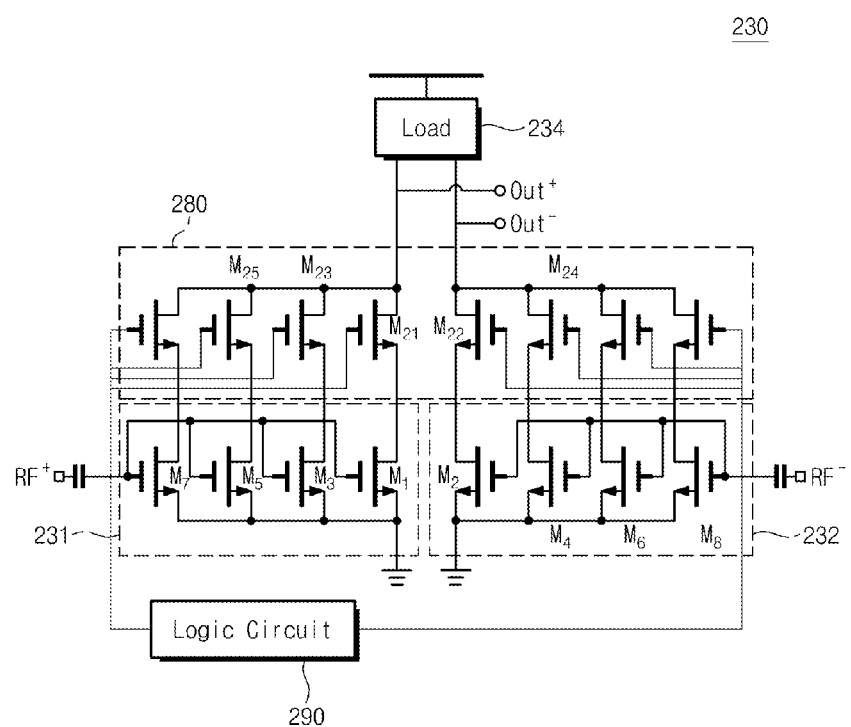
FIG. 5 is a view particularly illustrating a second order intermodulation cancellation unit included in the radio frequency receiver of FIG. 3.

FIG. 5 is a view particularly illustrating the second order intermodulation cancellation unit 230 included in the radio frequency receiver 300 of FIG. 3. Referring to FIG. 5, the second order intermodulation cancellation unit 230 includes the in-phase amplifier unit 231, the out-of-phase amplifier unit 232, the switch unit 280, the logic circuit 290, and a load 234.

The in-phase amplifier unit 231 includes a plurality of transistors M1, M3, M5, and M7 and amplifies the in-phase signal RF+. The transistors M1, M3, M5, and M7 included in the in-phase amplifier unit 231 are connected in cascade.

The our-of-phase amplifier unit 232 includes a plurality of transistors M2, M4, M6, and M8, and amplifies the out-of-phase signal RF−. The transistors M2, M4, M6, and M8 included in the out-of-phase amplifier unit 232 are connected in cascade.

The switch unit 280 includes a plurality of transistors M21 to M28. The transistors M21 to M28 included in the switch unit 280 are controlled according to output data of the logic circuit 290. The transistors M21 to M28 included in the switch unit 280 are connected in cascode configuration to the transistors M1 to M8 included in the in-phase amplifier unit 231 and the out-of-phase amplifier unit 232.

The logic circuit 290 changes equivalent resistances of the transistors M21 to M28 included in the switch unit 280. As the equivalent resistances of the transistors M21 to M28 are changed, the switch unit 280 performs a function similar to a switch, thereby compensating for mismatch between the in-phase signal Out+ and the out-of-phase signal Out−.

Figure 6:
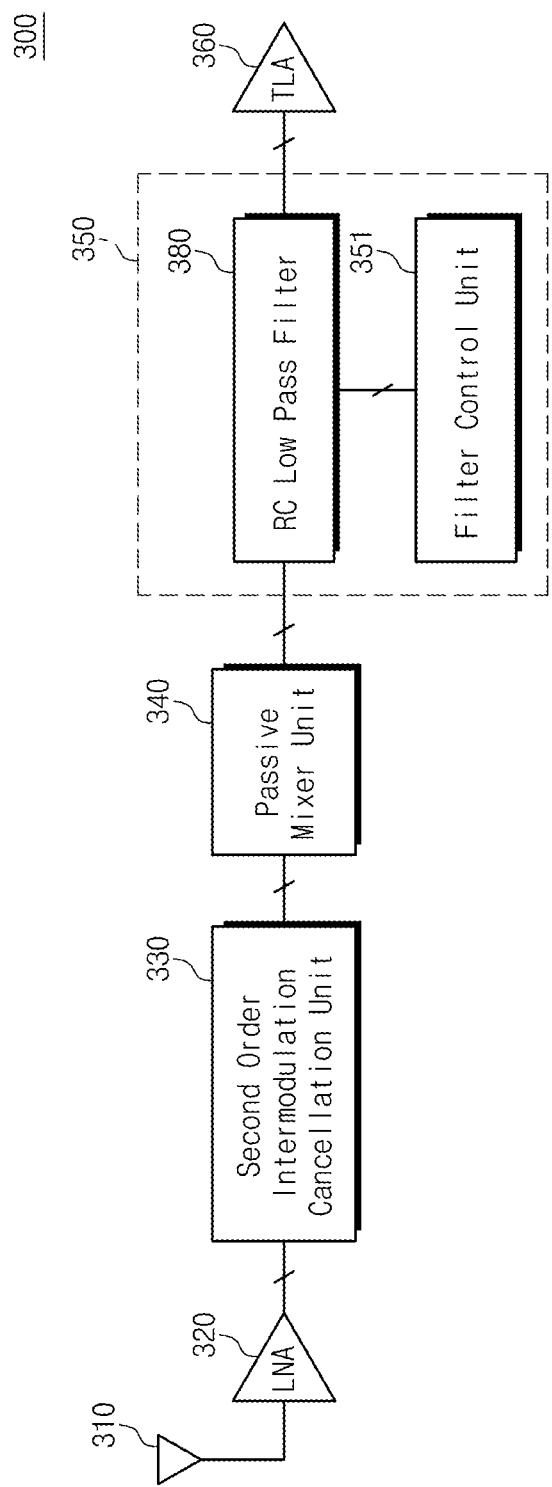
FIG. 6 is a view illustrating a radio frequency receiver according to another embodiment of the present invention.

FIG. 6 is a view illustrating a radio frequency receiver 300 according to another embodiment of the present invention. Referring to FIG. 6, the radio frequency receiver 300 includes an antenna 310, a low noise amplifier 320, a second order intermodulation cancellation unit 330, a passive mixer unit 340, a low pass filter unit 350, and a transimpedance amplifier 360.

The antenna 310, the low noise amplifier 320, the second order intermodulation cancellation unit 330, the passive mixer unit 340, and the transimpedance amplifier 360 are the same as those described with reference to FIGS. 1 to 3. Thus, detailed descriptions thereof will be omitted.

The low pass filter unit 350 includes an RC low pass filter 380 and a filter control unit 351. The RC low pass filter 380 is positioned between the passive mixer unit 340 and the transimpedance amplifier 360 and includes a resistor and a capacitor. The filter control unit 351 controls the pass band of the RC low pass filter 380. For example, an equivalent resistance or capacitance included in the RC low pass filter unit 350 may be controlled to control the pass band.

Figure 7:
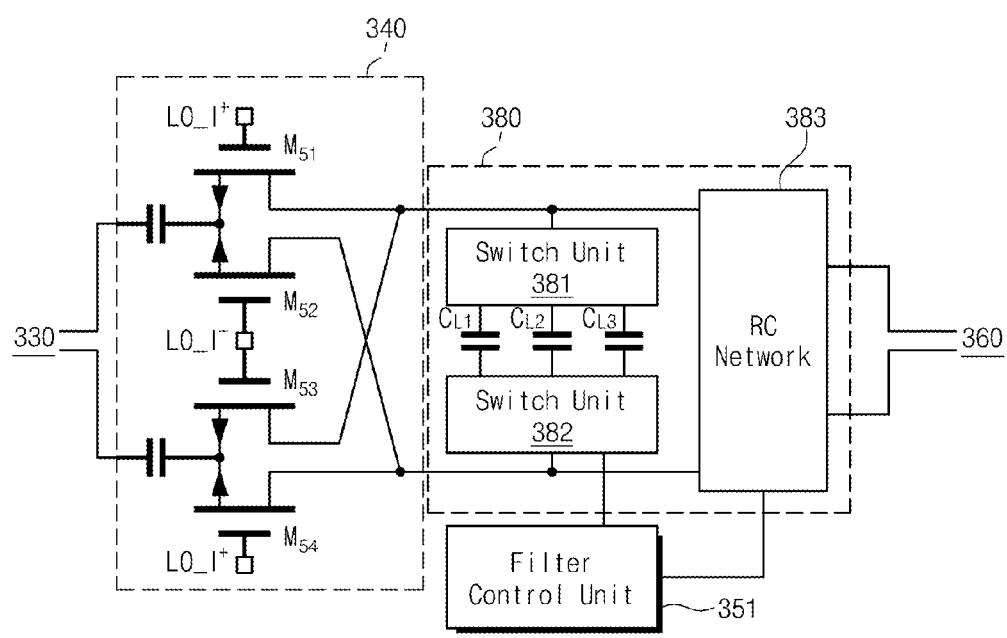
FIG. 7 is a view particularly illustrating a passive mixer unit and a low pass filter unit included in the radio frequency receiver of FIG. 6.

FIG. 7 is a view particularly illustrating the passive mixer unit 340 and the low pass filter unit 350 included in the radio frequency receiver 300 of FIG. 6. Referring to FIG. 7, the low pass filter unit 350 includes an RC network 383, a plurality of capacitors CL1 to CL3, a switch unit 381 and 382, and a filter control unit 351.

The RC network 383 has a specific resistance and capacitance. A plurality of capacitors CL1 to CL3 are connected to the RC network 382 in parallel. The switch units 381 and 382 are positioned between the plurality of capacitors CL1 to CL3 and the RC network 383, and change equivalent capacitances of the plurality of capacitors CL1 to CL3. The filter control unit 351 controls the switch units 381 and 382 to change the pass band of the RC low pass filter 380. That is, the switch units 381 and 382 and the filter control unit 351 change the equivalent capacitance of the RC low pass filter 380 to change the pass band.

Figure 8:
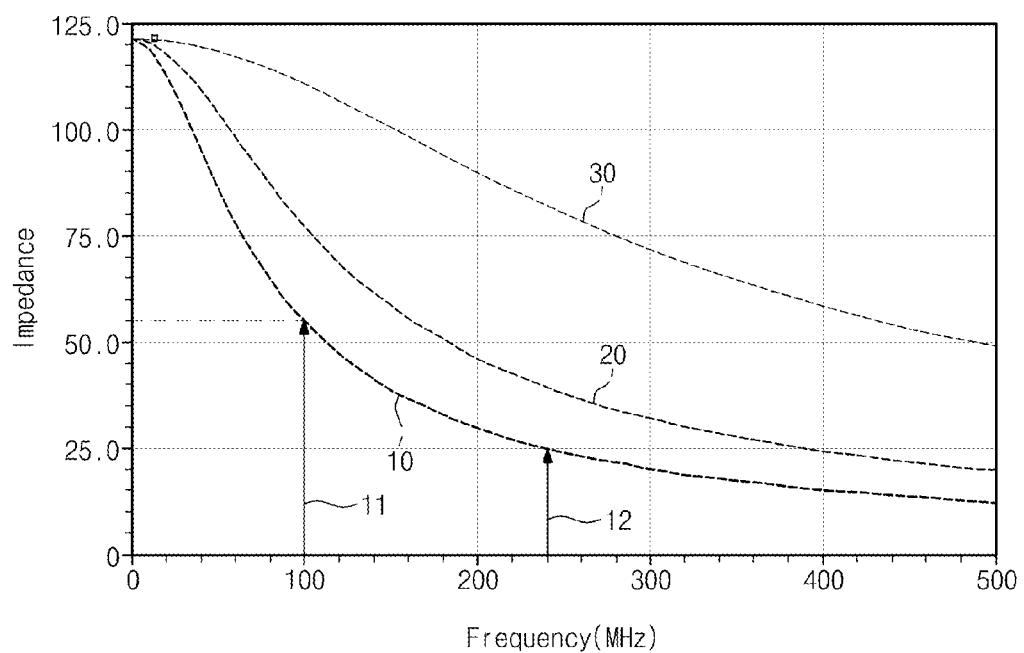
FIG. 8 is a view illustrating impedance characteristics with respect to frequency at input ends of low pass filter units included in the radio frequency receivers.

FIG. 8 is a view illustrating impedance characteristics with respect to frequency at input ends of the low pass filter units included in the radio frequency receivers 100 to 300. Referring to FIG. 8, there are three curves 10 to 30. The three curves 10 to 30 indicate the cases in which the pass bands are different, respectively. Thus, changes in frequency-impedance characteristics can be easily seen according to changes in the equivalent capacitances.

The lowest curve 10 will now be exemplified. When the frequency is 100 MHz, a signal 11 indicates a desired signal for communication. When the frequency is 240 MHz, a signal 12 indicates an out-of-band interference or jamming signal to be removed. The impedance at the frequency of the desired signal 11 is relatively great. That is, a current signal at the frequency where the impedance is great may be delivered to a transimpedance amplifier with no signal attenuation.

The passive mixer unit up-converts impedance characteristics at the input end of the low pass filter unit by an LO frequency. In other words, according to the impedance characteristics at the input end of the passive mixer unit, a frequency at which the impedance is 120 ohm in the y-axis is the LO frequency. That is, the current signal at the LO frequency where the impedance is great is delivered to the transimpedance amplifier with no attenuation. Since the impedance becomes smaller as it goes away from the LO frequency, a current signal of a jamming or interference signal having a frequency far from the LO frequency is significantly attenuated and delivered to the transimpedance amplifier. Accordingly, as described above, the passive mixer unit and the low pass filter unit function like a band pass filter having the LO frequency as a center frequency.

That is, the functions of a band pass filter can be realized without an SAW filter. The second order intermodulation cancellation unit reduces second order intermodulation caused by jamming or interference signals. Since the elements included in the radio frequency receiver according to the present invention can be disposed on a single substrate in the form of an integrated circuit, the radio frequency receiver according to the present invention can have a simple configuration and high integration efficiency and be manufactured at low cost, compared to typical receivers.

Figure 9:
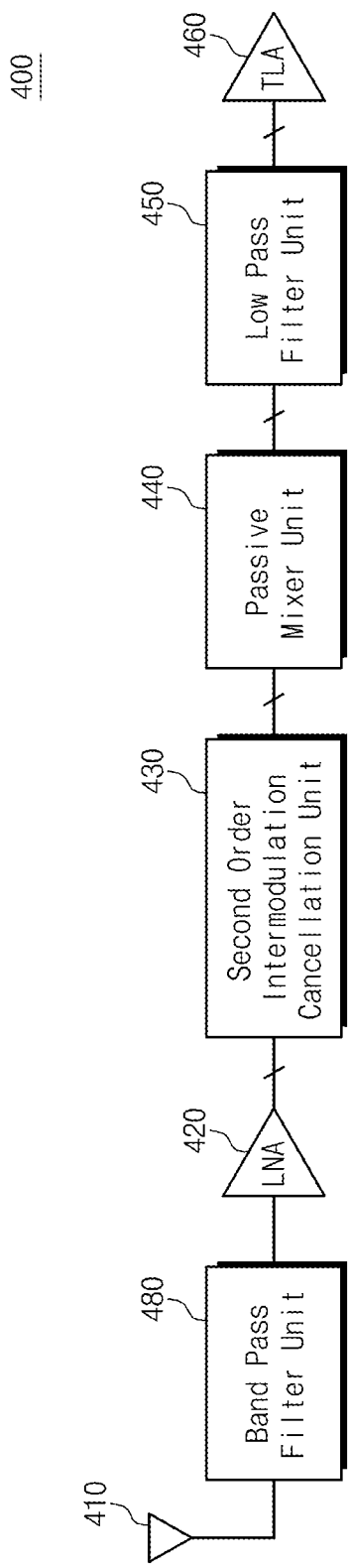
FIG. 9 is a view illustrating a radio frequency receiver according to another embodiment of the present invention.

FIG. 9 is a view illustrating a radio frequency receiver 400 according to another embodiment of the present invention. Referring to FIG. 9, the radio frequency receiver 400 includes an antenna 410, a low noise amplifier 420, a second order intermodulation cancellation unit 430, a passive mixer unit 440, a low pass filter unit 450, a transimpedance amplifier 460, and a band pass filter unit 480.

The antenna 410, the low noise amplifier 420, the second order intermodulation cancellation unit 430, the passive mixer unit 440, the low pass filter unit 450, and the transimpedance amplifier 460 are the same as those described with reference to FIGS. 1, 3, and 6. Thus, detailed descriptions thereof will be omitted.

The band pass filter unit 480 is positioned between the antenna 410 and the low noise amplifier 420 and to receive signals through antenna 410 and deliver a signal having a predetermined frequency band among the received signals to the low noise amplifier 420.

Figure 10:
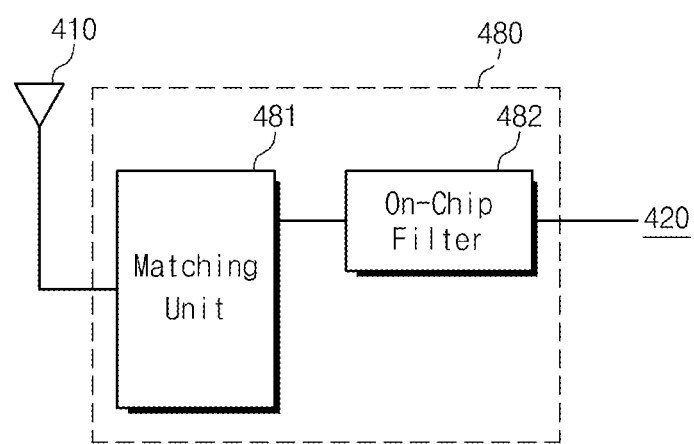
FIG. 10 is a view particularly illustrating a band-pass filter unit included in the radio frequency receiver of FIG. 9.

FIG. 10 is a view particularly illustrating the band pass filter unit 480 included in the radio frequency receiver 400 of FIG. 9. Referring to FIG. 10, the band pass filter unit 480 includes a matching unit 481 and an on-chip filter 482.

The on-chip filter 482 is a passive filter which is provided by forming a transmission line on a silicon substrate. The transmission line may serve as an inductor or capacitance according to its shape.

The matching unit 481 matches the impedance between the on-chip filter 482 and the antenna 410. Due to the impedance matching of the matching unit 481, the power of a received signal is effectively transferred.

In mobile communication systems using broadband signals, the second order intermodulation cancellation unit 430, the passive mixer unit 440, and the low pass filter unit 450 may not attenuate out-of-band jamming or interference signals significantly. In this case, the radio frequency receivers of FIGS. 9 and 10 can attenuate out-of-band jamming or interference signals by about 10 dB or more using the matching unit 481 and the on-chip filter 482 before delivering a received signal to the low-noise amplifier 420. The radio frequency receivers of FIGS. 9 and 10 can also effectively cancel out-of-band jamming or interference signals without using a SAW filter. Furthermore, since the additionally added on-chip filter 482 can be provided in the form of a transmission line, the radio frequency receiver 400 of the current embodiment can have a simple configuration and high integration efficiency and be manufactured at low cost, compared to typical receivers.

As described above, the radio frequency receiver according to the present invention removes out-of-band jamming signals and interference signals without a SAW filter. Radio frequency receiver used in Multi-band MIMO can be simplified by the present invention. The radio frequency receiver of the present invention can be manufactured at low cost. In addition, the radio frequency receiver can have a variable bandwidth and be effectively used for mobile communication using broadband signals.

The above-disclosed subject matter is to be considered illustrative, and not restrictive, and the appended claims are intended to cover all such modifications, enhancements, and other embodiments, which fall within the true spirit and scope of the present invention. While specific terms were used, they were not used to limit the meaning or the scope of the present invention described in Claims, but merely used to explain the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A radio frequency receiver comprising:
a low noise amplifier (LNA) amplifying a signal received through an antenna;
a second order intermodulation cancellation unit removing second order intermodulation caused by an out-of-band jamming or interference signal included in a signal output from the low noise amplifier;
a passive mixer unit converting a frequency of a signal output from the second order intermodulation cancellation unit; and
a low pass filter unit removing an out-of-band jamming or interference signal included in a signal output from the passive mixer unit and delivering the signal from which the out-of-band jamming or interference signal is removed to a transimpedance amplifier (TIA).

2. The radio frequency receiver of claim 1, wherein the second order intermodulation cancellation unit comprises:
a signal amplifier unit converting the signal output from the low noise amplifier into a current signal and differentially amplifying the current signal; and
a second intercept point (IP2) control unit calibrating mismatch between a plurality of differentially amplified signals.

3. The radio frequency receiver of claim 2, wherein the signal amplifier unit comprises:
an in-phase amplifier unit amplifying an in-phase signal of the output signal of the low noise amplifier; and
an out-of-phase amplifier unit amplifying an out-of-phase signal of the output signal of the low noise amplifier.

4. The radio frequency amplifier of claim 2, wherein the IP2 control unit calculates mismatch caused by a manufacturing process of the signal amplifier unit or mismatch caused by aging of the signal amplifier unit.

5. The radio frequency amplifier of claim 4, wherein the mismatch caused by a manufacturing process comprises mismatch due to source voltage variation or mismatch due to temperature variation.

6. The radio frequency receiver of claim 3, wherein the IP2 control unit comprises:
a logic circuit previously storing calibration data for calibrating the mismatch between the plurality of differentially amplified signals; and
a switch unit controlling outputs of the in-phase amplifier unit and the out-of-phase amplifier unit according to an output of the logic circuit.

7. The radio frequency receiver of claim 6, wherein the in-phase amplifier unit, the out-of-phase amplifier unit, and the switch unit comprise a plurality of transistors, respectively,
the transistors included in the in-phase amplifier unit are connected in cascade,
the transistors included in the out-of-phase amplifier unit are connected in cascade, and
the transistors included in the switch unit are connected with the transistors included in the in-phase amplifier unit and the out-of-phase amplifier unit in cascode, and
wherein the logic circuit changes equivalent resistances of transistors included in the switch unit.

8. The radio frequency receiver of claim 2, wherein the low pass filter unit comprises:
an RC low pass filter comprising a resistor and a capacitor; and
a filter control unit controlling a pass band of the RC low pass filter.

9. The radio frequency receiver of claim 8, wherein the filter control unit changes an equivalent capacitance of the RC low pass filter.

10. The radio frequency receiver of claim 9, wherein the RC low pass filter comprises:
an RC network having a specific resistance and capacitance;
a plurality of capacitors connected with the RC network in parallel; and
a switch unit changing equivalent capacitances of the plurality of capacitors,
wherein the filter control unit controls the switch unit.

11. The radio frequency receiver of claim 8, wherein the low pass filter unit delivers the current signal to the transimpedance amplifier in proportion to an impedance seen from an input end of the passive mixer unit, and
the impedance has a maximum value at a local oscillator (LO) frequency and decreases symmetrically with respect to the LO frequency in directions away from the LO frequency.

12. The radio frequency receiver of claim 11, further comprising a band pass filter unit receiving signals through the antenna and delivering a signal having a predetermined frequency band among the received signals to the low noise amplifier.

13. The radio frequency receiver of claim 12, wherein the band pass filter unit comprises:
an on-chip filter provided in the form of a transmission line on a silicon substrate and;
a matching unit matching impedances between the on-chip filter and the antenna.

* * * * *